United States Patent [19]
Lee et al.

[11] Patent Number: 5,838,618
[45] Date of Patent: Nov. 17, 1998

[54] BI-MODAL ERASE METHOD FOR ELIMINATING CYCLING-INDUCED FLASH EEPROM CELL WRITE/ERASE THRESHOLD CLOSURE

[75] Inventors: Jian-Hsing Lee; Juang-Ker Yeh, both of Hsin-Chu; Kuo-Reay Peng, Faung-San; Ming-Chou Ho, Taichung, all of Taiwan

[73] Assignee: Taiwan Semiconductor Manufacturing Company Ltd., Hsin-Chu, Taiwan

[21] Appl. No.: 927,472

[22] Filed: Sep. 11, 1997

[51] Int. Cl.[6] .............................. G11C 16/04; G11C 7/00
[52] U.S. Cl. ................ 365/185.29; 365/185.18; 365/185.33; 365/218
[58] Field of Search .................... 365/185.29, 185.33, 365/185.18, 218

[56] References Cited

U.S. PATENT DOCUMENTS

| | | | |
|---|---|---|---|
| 5,412,608 | 5/1995 | Oyama | 365/218 |
| 5,481,494 | 1/1996 | Tang et al. | 365/185.24 |
| 5,485,423 | 1/1996 | Tang et al. | 365/185.29 |
| 5,521,866 | 5/1996 | Akaogi | 365/185.29 |
| 5,561,620 | 10/1996 | Chen et al. | 365/185.29 |
| 5,726,933 | 3/1998 | Lee et al. | 365/185.29 |

*Primary Examiner*—David Nelms
*Assistant Examiner*—Trong Phan
*Attorney, Agent, or Firm*—George O. Saile; Stephen B. Ackerman; Bill Knowles

[57] ABSTRACT

A method to erase data from a flash EEPROM while electrical charges trapped in the tunneling oxide of a flash EEPROM are eliminated to maintain proper separation of the programmed threshold voltage and the erased threshold voltage after extended programming and erasing cycles. The method to erase a flash EEPROM cell begins by channel erasing to remove charge from the floating gate of the flash EEPROM cell. The channel erasing consists of applying a first relatively large negative voltage pulse to the control gate of said EEPROM cell and concurrently applying a first moderately large positive voltage pulse to a first diffusion well. At the same time a ground reference potential is applied to the semiconductor substrate, while the drain and a second diffusion well is allowed to float. The method to erase then proceeds with the source erasing to detrap the tunneling oxide of the flash EEPROM cell. The source erasing consists continued floating the drain and the second diffusion well and concurrently applying the ground reference potential to the semiconductor substrate and the first diffusion well. Concurrently a second relatively large negative voltage pulse is applied to the control gate, as a second moderately large positive voltage pulse is applied to said source.

32 Claims, 5 Drawing Sheets

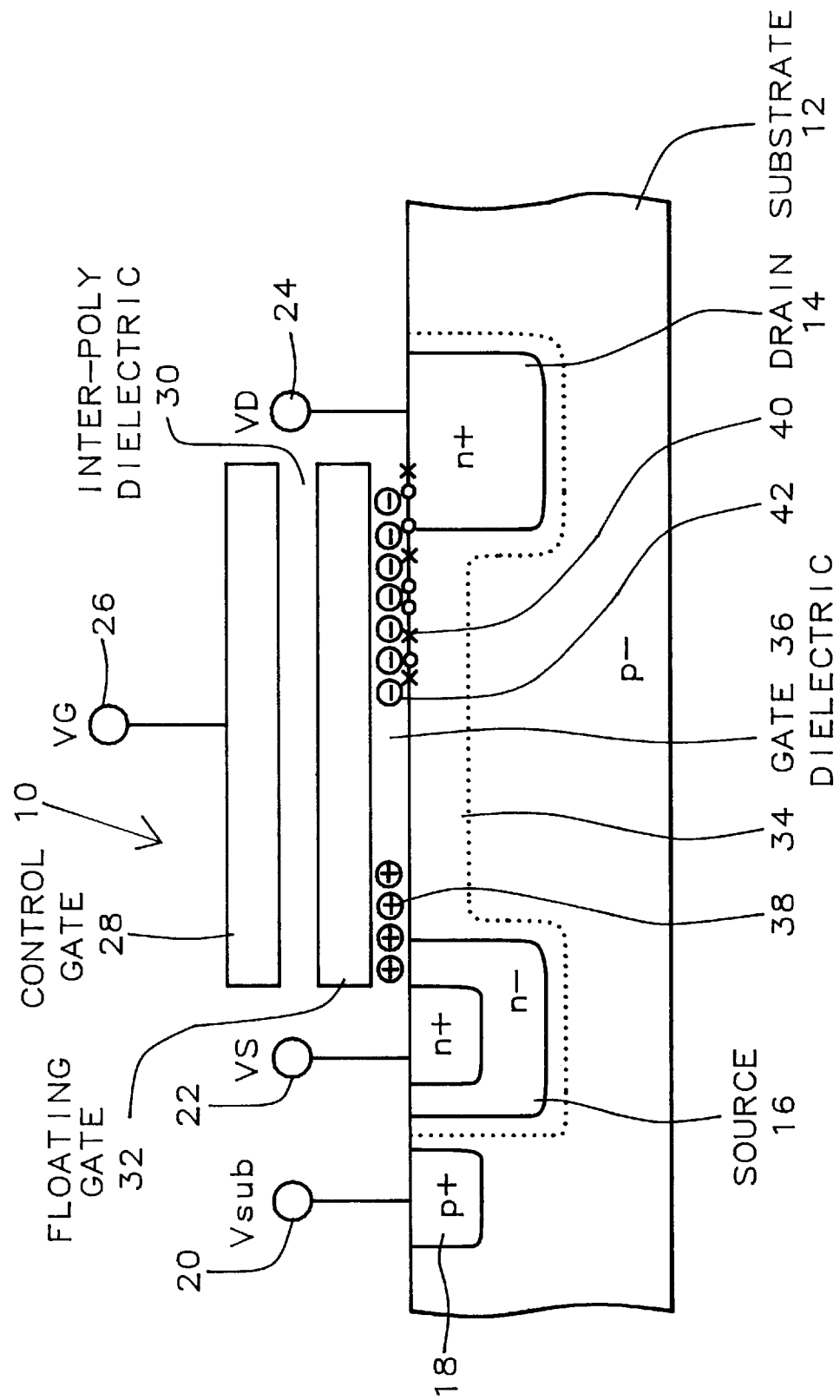
FIG. 1a – Prior Art

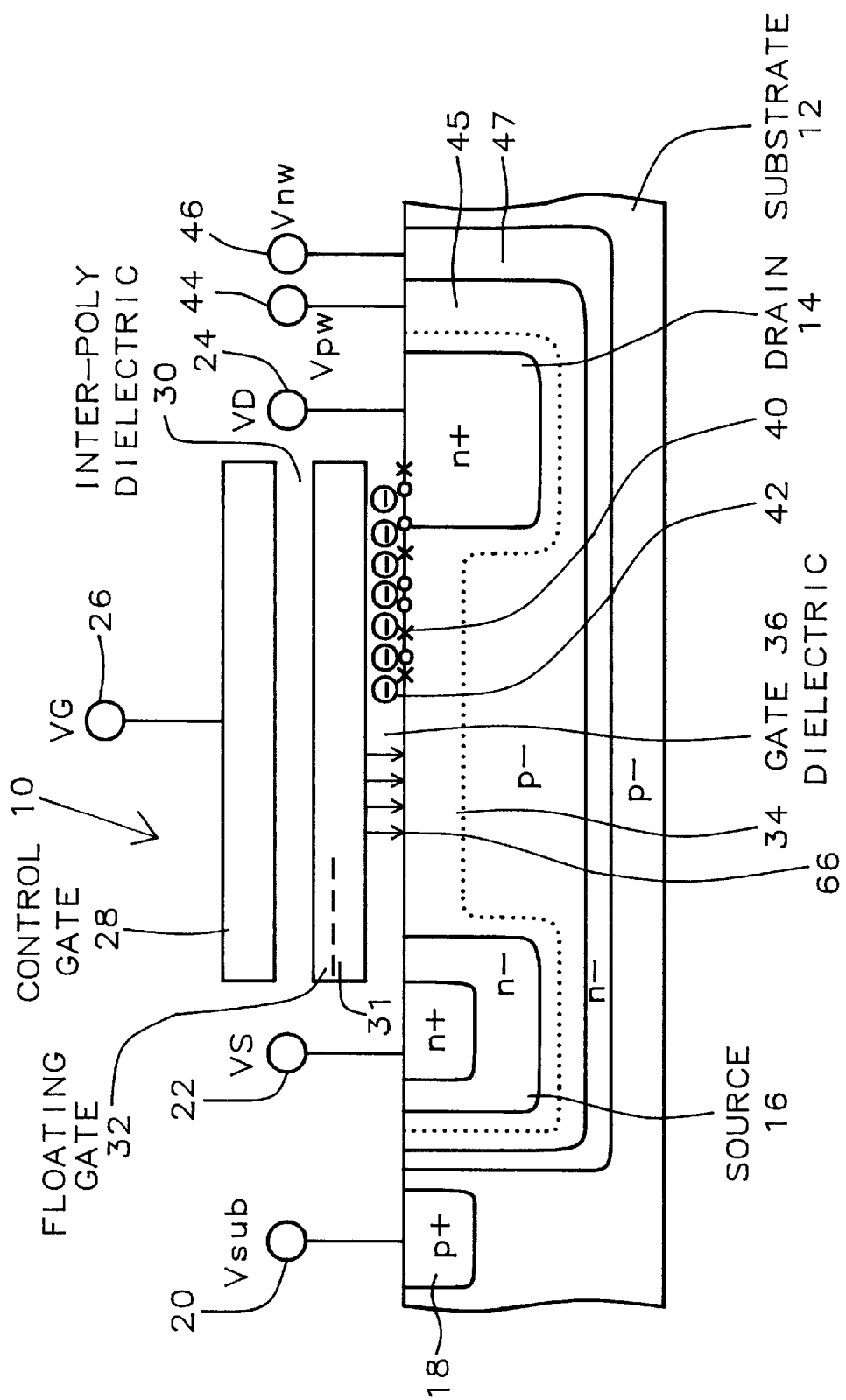
FIG. 1b – Prior Art

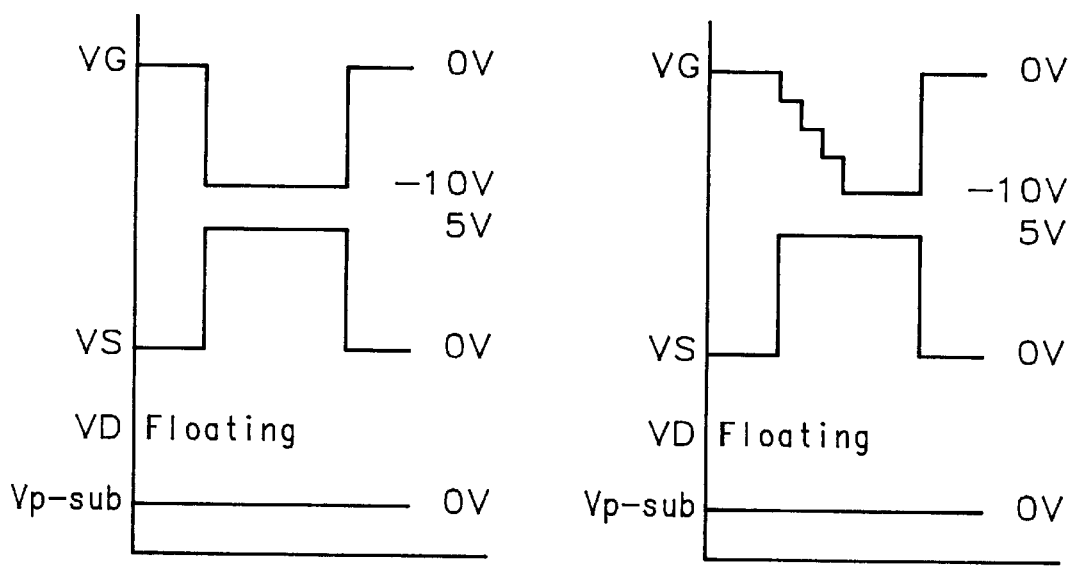
FIG. 2a – Prior Art
FIG. 2b – Prior Art
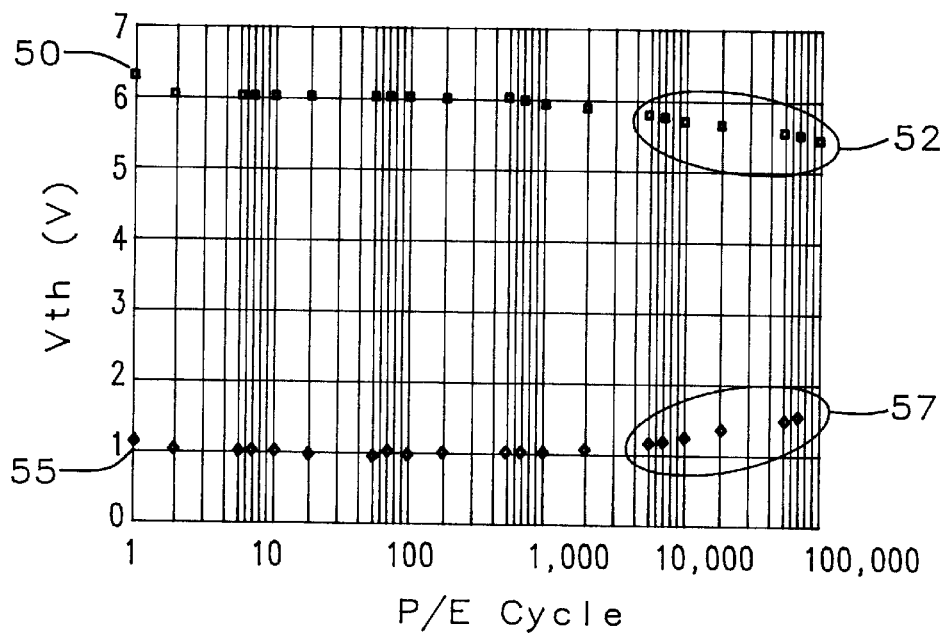
FIG. 3 – Prior Art

BI-MODAL ERASE METHOD FOR ELIMINATING CYCLING-INDUCED FLASH EEPROM CELL WRITE/ERASE THRESHOLD CLOSURE

BACKGROUND OF THE INVENTION

1. Related Patent Applications

"A Novel Method To Improve Flash EEPROM Write/Erase Threshold Closure," Ser. No. 08/928,217, Filing Date: Sep. 12, 1997, assigned to the Same Assignee as the present invention.

"A Novel Method to Erase A Flash EEPROM Using Negative Gate Source Erase Followed By a High Negative Gate Erase," Ser. No. 08/928,127, Filing Date: Sep. 12, 1997, assigned to the Same Assignee as the present invention.

"A Mixed Mode Erase Method To Improve Flash EEPROM Write/Erase Threshold Closure," Ser. No. 08/907,984, Filing Date: Aug. 11, 1997, assigned to the Same Assignee as the present invention.

"A Novel Erase Method Of Flash EEPROM By Using Snapback Characteristic," Ser. No. 08/957,678, Filing Date: Oct. 24, 1997, assigned to the Same Assignee as the present invention.

2. Field of the Invention

This invention relates generally to a class of non-volatile memory devices referred to as flash electrically erasable programmable read-only memory (flash EEPROM). More particularly, this invention relates to methods and means to erase digital data from a flash EEPROM cell and for eliminating trapped charges from the flash EEPROM cell.

3. Description of Related Art

The structure and application of the flash EEPROM is well known in the art. The Flash EEPROM provides the density advantages of an erasable programmable read-only memory (EPROM) that employs ultraviolet light to eliminate the programming with the speed of a standard EEPROM. FIG. 1a illustrates a cross-sectional view of a flash EEPROM cell of the prior art. The flash EEPROM cell 10 is formed within a p-type substrate 12. An $n^+$ drain region 14 and an $n^+$ source region 16 is formed within the p-type substrate 12.

A relatively thin gate dielectric 36 is deposited on the surface of the p-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A $p^+$ diffusion 18 is placed in the p-type substrate 12 to provide a low resistance path from a terminal 20 to the p-type substrate. The terminal 20 will be attached to a substrate voltage generator Vsub. In most application of an EEPROM, the substrate voltage generator Vsub will be set to the ground reference potential (0V).

The source region 16 will be connected to a source voltage generator VS through the terminal 22. The control gate 28 will be connected through the terminal 26 to the control gate voltage generator VG. And the drain region 14 will be connected through the terminal 24 to the drain voltage generator VD.

According to conventional operation, the flash EEPROM cell 10 is programmed by setting the gate control voltage generator VG to a relatively high voltage (on the order of 10V). The drain voltage generator VD is set to a moderately high voltage (on the order of 5V), while the source voltage generator VS is set to the ground reference potential (0V).

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process some of the hot electrons will be trapped 42 in the tunneling oxide 36 or in surface states 40 at the surface of the p-type substrate 12. These trapped electrons will cause the threshold voltage of the erased flash EEPROM cell 10 to increase.

To erase the flash EEPROM cell 10 as described in U.S. Pat. No. 5,481,494 (Tang et al.), as shown in FIG. 2a, a moderately high positive voltage (on the order of 5V) is generated by the source voltage generator VS. Concurrently, the gate control voltage generator VG is set to a relatively large negative voltage (on the order of −10V). The substrate voltage generator VS are set to the ground reference potential. The drain voltage generator VD is usually disconnected from the terminal 24 to allow the drain region 14 to float. Under these conditions there is a large electric field developed across the tunneling oxide 36 in the source region 16. This field causes the electrons trapped in the floating gate 32 to flow to portion of the floating gate 32 that overlaps the source region 16. The electrons are then extracted to the source region 16 by the Fowler-Nordheim tunneling.

Further Tang et al. shows a method for tightening the threshold voltage VT distribution of an array of flash EEPROM cells. The moderately high positive voltage (5V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

Referring back to FIG. 1a during the erasure process, as a result of band to band tunneling, some positive charges or "hot holes" 38 will be forced and trapped in the tunneling oxide 36. These trapped positive charges or "hot holes" 38 will cause the threshold voltage of the programmed flash EEPROM cell 10 to decrease. As can be shown in FIG. 3, after repeatedly performing write/erase cycling, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time the flash EEPROM will no longer be able to operate reliably to store digital data.

U.S. Pat. No. 5,485,423 (Tang et al.) as shown in FIG. 2b, describes a method of erasure of a flash EEPROM. A moderately large positive voltage pulse is generated by the source voltage generator VS. Simultaneously, a negative ramp voltage is developed by the gate control voltage generator VD. The drain voltage generator VG will be disconnected from the drain to allow the drain to float and the substrate voltage generator will be set to the ground reference potential as above described. This method will achieve an averaging of the tunneling field during the entire erase cycle.

U.S. Pat. No. 5,521,866 (Akaogi) and as shown in FIG. 1b describes a non volatile semiconductor memory device having a floating gate 32. The memory device is constructed with a n-well 47 diffused into the semiconductor substrate 12 and a p-well 45 diffused into the n-well 47. The source region 16 and drain 14 are then diffused into the p-well 45 with a floating gate 32 and control gate 28 disposed on the surface of the semiconductor substrate much as described in FIG. 1a. The erasure process involves applying a positive voltage to p-well 45 and the n-well 47.

U.S. Pat. No. 5,412,608 (Oyama) describes a method of erasing a flash EEPROM cell by applying a relatively large negative pulse to the control gate followed by a relatively large positive pulse to the control gate. The relatively large negative pulse will erase the flash EEPROM cell, while the relatively large positive pulse will equalize the threshold voltages of an array of flash EEPROM cells.

SUMMARY OF THE INVENTION

An object of this invention is to provide a method for the erasure of data from a flash EEPROM.

Another object of this invention is to provide a method to eliminate electrical charges trapped in the tunneling oxide and within surface states at the interface of the semiconductor substrate.

Further another object of this invention is to eliminate electrical charges trapped in the tunneling oxide of a flash EEPROM to maintain proper separation of the programmed threshold voltage and the erased threshold voltage after extended programming and erasing cycles.

To accomplish these and other objects a method to erase a flash EEPROM cell begins by channel erasing the flash EEPROM cell. The channel erasing consists of applying a first relatively large negative voltage pulse to the control gate of said EEPROM cell and concurrently applying a first moderately large positive voltage pulse to a first diffusion well. At the same time a ground reference potential is applied to the semiconductor substrate, while the drain and a second diffusion well is allowed to float. The method to erase then proceeds with the source erasing to detrap the flash EEPROM cell. The source erasing consists continued floating the drain and the second diffusion well and concurrently applying the ground reference potential to the semiconductor substrate and the first diffusion well. Concurrently a second relatively large negative voltage pulse is applied to the control gate, as a second moderately large positive voltage pulse is applied to said source.

BRIEF DESCRIPTION OF THE DRAWINGS

FIGS. 1a and 1b are cross-sectional views of flash EEPROM's of the prior art.

FIGS. 2a and 2b are timing diagrams of erase cycles of the flash EEPROM of the prior art.

FIG. 3 is a plot of the threshold voltages versus the number of programming and erasing cycles, using the erasing cycle of the prior art as shown in FIG. 2a.

DETAILED DESCRIPTION OF THE INVENTION

Figure 4:
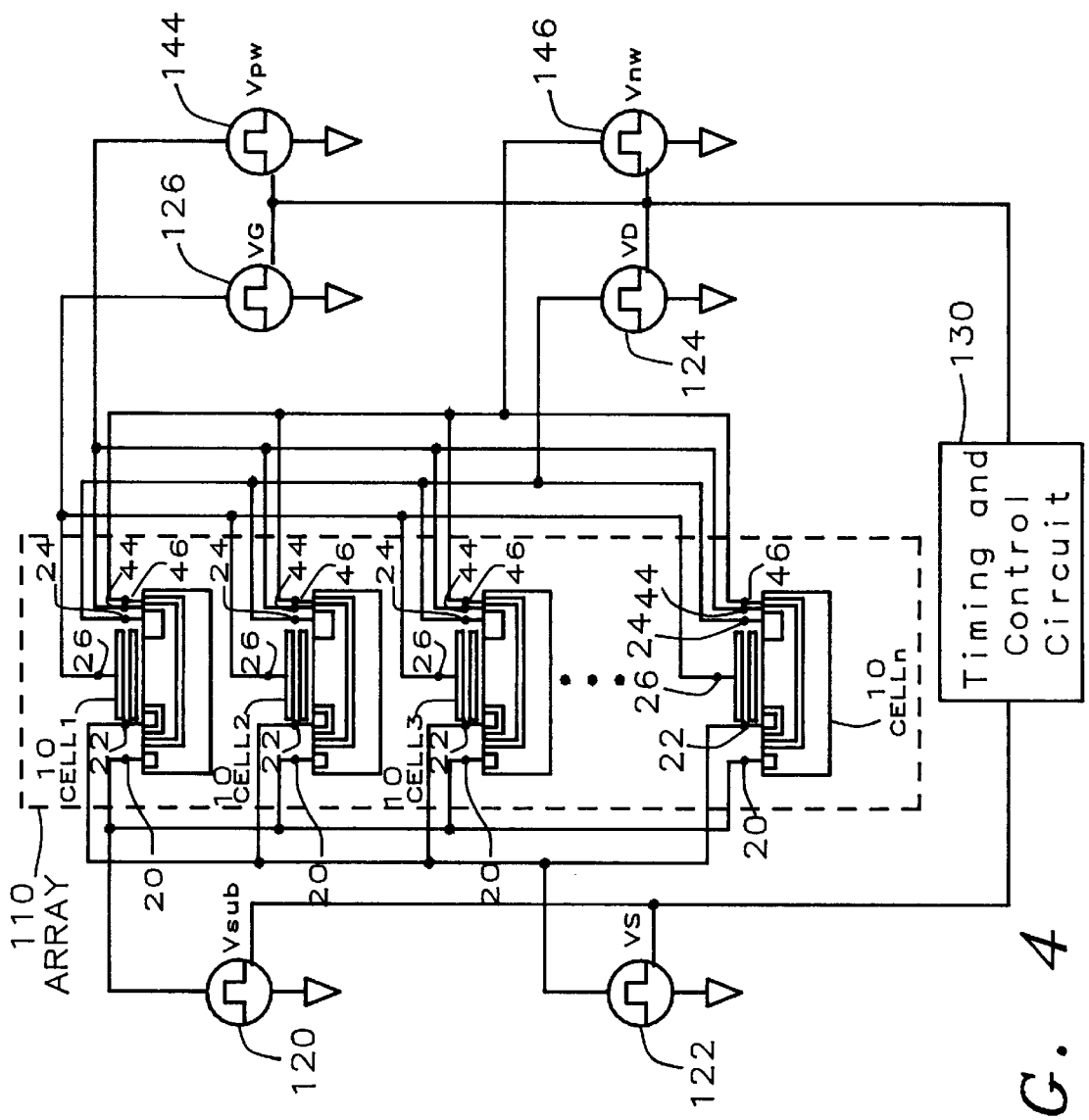
FIG. 4 is an array of flash EEPROM cells showing the connections of the voltage generators of this invention.

Referring now to FIG. 4, an array 110 of flash EEPROM cells 10 are disposed upon a common substrate. For convenience of design, the cells Cell1, Cell2, Cell3, . . . , Celln will be formed into rows and column. The array will have auxiliary circuitry (not shown) that will address either the individual cells Cell1, Cell2, Cell3, . . . , Celln or groups of cells for reading from the cells or for writing or programming the cells. The writing or programming procedures will as described for the flash EEPROM cell of FIG. 1a.

The connection for the substrate voltage generator Vsub 120 will be connected through the terminal 20 to the p-type substrate. The connection of the source voltage generator VS 122 to the source region is through the terminal 22. The connection of the drain voltage generator VD 124 to the drain region is through terminal 24. The connection of the gate control voltage generator VG 126 to the control gate is through the terminal 26. The p-well voltage generator Vpw 144 and the n-well voltage generator Vnw 146 will be connected respectively to the p-well 45 and the n-well 47 through terminals 44 and 46. The timing and control circuitry 130 in conjunction with the auxiliary circuitry (not shown) will determine the voltages and timings for the substrate voltage generator Vsub 120, the source voltage generator VS 122, the drain voltage generator VD 124, the gate control voltage generator VG 126 the p-well voltage generator Vpw 144, and the n-well voltage generator Vnw 146.

Figure 5:
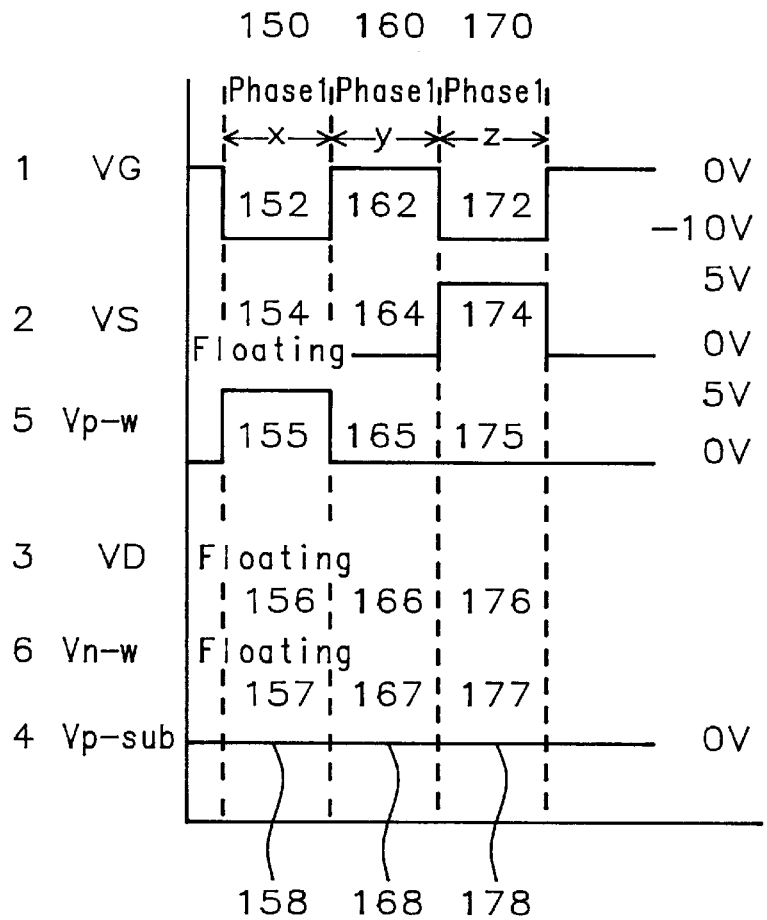
FIG. 5 is timing diagram of an erase cycle of a flash EEPROM of this invention.

Refer now to FIGS. 1b, 4, and 5 to understand the bi-modal erase cycle of this invention. The initial period of the bi-modal erase cycle (phase 1) or channel erase phase 150 starts by setting the gate control voltage generator VG 126 and thus the control gate to a relatively large negative voltage (−10V) 152. The source voltage generator VS 122 will be disconnected from the source region 16 to allow the source region 16 to be floating 154. The p-well voltage generator Vpw 144 and thus the p-well 45 will be set to a first moderately high voltage (5V) 155. The n-well voltage generator Vnw 146 will be disconnected from the n-well 47 to allow the n-well 47 to be floating 157. The drain voltage generator VD 124 will be disconnected from the drain region 14 to be floating 156. The substrate voltage generator Vsub 120 and thus the p-type substrate 12 will be set to the ground reference potential (0V) 158. The voltages as described and shown in FIG. 1b will force the trapped charges 31 on the floating gate 32 of the flash EEPROM cell 10 will be forced by the electric field 66 in the tunneling oxide 36 to flow through the tunneling oxide 36 by the Fowler-Nordheim tunneling into the source region 16. At the completion of the phase 1 150 there will be electrons 42 that have been trapped in the tunneling oxide 36 and at the surface states 40, again as described above.

A second phase of the bi-modal erase cycle (phase 2) 160 will terminate the channel erase cycle and act as a transition interval between the channel erase cycle (phase 1) 150 and the source erase cycle (phase 3) 170. The transition interval begins (phase 2) 160 by bringing the source voltage generator VS 122, the p-well voltage generator Vpw 144 and the gate control voltage generator VG 126 to the ground reference potential (0V) 162, 164 and 165. The substrate voltage generator Vsub 120 will remain at the ground reference potential (0V) 168. The drain voltage generator VD 124 will remain disconnected from the drain region 24 to keep the drain region 24 floating 166, and the n-well voltage generator Vnw 146 will remain disconnected from the n-well 47 to keep the n-well 47 floating 167.

Having terminated the channel erase cycle 150 in phase 2 160, the source erase cycle (phase 3) 170 of the bi-modal erase cycle can begin. The gate control voltage generator VG 126 is brought again the relatively large negative voltage (−10V) 172. Concurrently, the source voltage generator VS 122 is set to a second moderately large voltage (5V) to bring the source region 16 to the second moderately large voltage (5V) 174. At this time, the substrate voltage generator Vsub 120 and thus the p-type substrate 12 will remain at the ground reference potential (0V) 178. While the drain voltage generator VD 124 will remain disconnected from the drain region 14 thus maintaining the drain region 14 at a floating condition 176, and the n-well voltage generator Vnw 146 will remain disconnected from the n-well 47 to keep the n-well 47 floating 177.

The electric field 66 within tunneling oxide 36 must be in the saturation region. The field is dependent upon the voltage of the gate control voltage generator VG, the p-well voltage generator Vpw and the number of trapped electrons 40 in the tunneling oxide 36 and in the surface states 42. Thus the tunneling oxide field becomes:

$$\epsilon_{tunneling\_oxide} = K_{GC}VG + \frac{Q_{trap}}{C_{ox}} + K_{pw-c}Vpw$$

Where:
$Q_{trap}$ is the charge of the electrons trapped in the floating gate 36.
$K_{GC}$ is the coupling ratio of the control gate.
$K_{pw-c}$ is the coupling ratio of the p-well 45.

The magnitude applied voltages of the gate control voltage generator Vg, and the p-well voltage generator Vpw will be dependent on the thickness of the tunneling oxide 36 and the interpoly dielectric 30, which will vary with the technology parameters.

As can be seen from the above equation, the channel erase cycle (phase 1) 150 will operate at high field due to the number of electrons available in the floating gate 32. Though the electrons 40 and 42 trapped in the tunneling oxide 36 can be detrapped during the channel erase cycle (phase 1) 150, a certain number of trapped centers will be generated due to the high field and high current that passes through the tunneling oxide 36. However, if the duration of the channel erase cycle (phase 1) 150 is shortened compared to the prior art, the degradation can be minimized.

Figure 6:
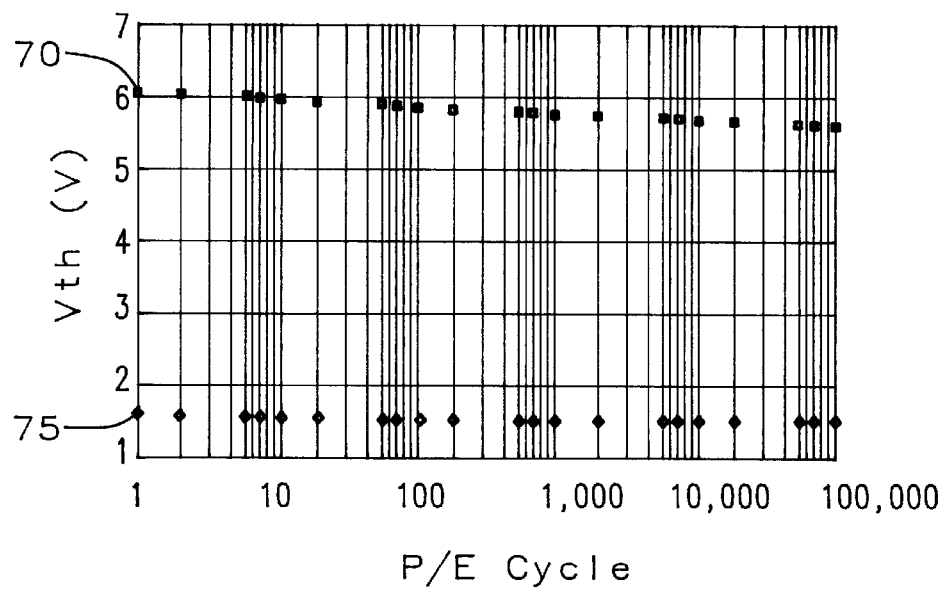
FIG. 6 is a plot of the threshold voltages versus the number of programming and erasing cycles using the erase cycle of this invention as shown in FIG. 5.

The source erase cycle (phase 3) 170 will now operate at a relatively low field, since some of the electrons have been removed during the channel erase cycle (phase 1) 150. This will prevent any generation of the positive charges or "hot holes" as described in FIG. 1a to be trapped in the tunneling oxide 36. These positive charges or "hot holes" will cause the degradation of the threshold voltage $V_T$ as shown in FIG. 3. Since there will be no generation of the positive charges or "hot holes", there will be no degradation of the threshold voltage $V_T$ using the bi-modal erasing cycle of this invention over time as shown in FIG. 6.

The relative period of time for the phase 1 150 and Phase 3 170 of the bi-modal erase cycle is from approximately 10 m sec to 2 sec. in duration. Phase 2 160 is from approximately 0–2 m sec in duration.

Refer now to FIG. 1b for a description of the physical basis for the detrapping phase of the erase cycle of the flash EEPROM of this invention. As above described, during the channel erase phase (phase 3), the gate control voltage generator VG is set to the second relatively large negative voltage (−10V). Since the gate control voltage generator VG is connected through the terminal 26 to the control gate 28, the control gate 28 will be set to the second relatively large negative voltage (−10V). The drain 14 and the n-well 47 will be disconnected from their respective voltage generators and allowed to be floating. The voltage of the substrate voltage generator Vsub and the p-well voltage generator Vpw will be set to the ground reference potential (0V) which will be respectively connected through terminal 20 to the p-type substrate 12 and through terminal 44 to the p-well 45. The source voltage generator VS and thus the source will be set to the second moderately large voltage (5V).

The voltages as described will set up an electric field 66 in the gate dielectric or tunneling oxide 36. Those electrons 42 trapped in the tunneling oxide 36 will be forced to be dissipated in the p-type substrate while there will be no positive charges or "hot holes" generated at during the source erase cycle, thus eliminating any residual charges from the floating gate 32 or trapped charges 42 from the tunneling oxide 36.

This process will insure that the erased threshold voltage for the flash EEPROM cell 10 will return to the low threshold voltage of a completely erased cell. The elimination of the trapped charges 42 will also allow the appropriate increase of the programmed threshold voltage to the high threshold voltage approximately (6V) of a programmed cell.

As is shown in FIG. 6, the programmed threshold voltage 70 will remain at a relatively constant value of approximately 6V (changing by less than 0.5V) for at least 100,000 programming/erase cycles. Also, as can be seen, the erased threshold voltage 75 will remain at a constant value of approximately 0.5V for the 100,000 programming/erase cycles. By not degrading the threshold as seen in FIG. 3a, the flash EEPROM cell 10 of FIG. 1b and the flash EEPROM array 110 of FIG. 4 will maintain operation without failure for programming/erase cycle in excess of 100,000 cycles.

While this invention has been particularly shown and described with reference to the preferred embodiments thereof, it will be understood by those skilled in the art that various changes in form and details may be made without departing from the spirit and scope of the invention.

What is claimed is:

1. A method to erase a flash EEPROM cell, which is comprised of a source and a drain diffused within a first well of a first conductivity type which is diffused into a second well of a second conductivity type which is further diffused in to a semiconductor substrate of the first conductivity type, and a control gate, a floating gate, and a tunneling oxide disposed upon the semiconductor substrate, to improve a write/erase threshold voltage closure from repeatedly writing and erasing said flash EEPROM cell, comprising the steps of:

a) channel erasing said flash EEPROM cell by the steps of,
    applying a first relatively large negative voltage pulse to the control gate of said EEPROM cell,
    concurrently applying a first moderately large positive voltage pulse to said first well,
    concurrently applying a ground reference potential to the semiconductor substrate,
    concurrently floating said drain, source, and second well; and then
  b) source erasing to detrap said flash EEPROM cell by the steps of:
    floating said drain and said second well,
    concurrently applying the ground reference potential to said semiconductor substrate and said first well,
    concurrently applying a second relatively large negative voltage pulse to said control gate, and concurrently applying a second moderately large positive voltage pulse to said source.

2. The method to erase a flash EEPROM cell of claim 1 wherein channel erasing the flash EEPROM removes charges from the floating gate.

3. The method to erase a flash EEPROM cell of claim 1 wherein channel erasing to detrap the flash EEPROM removes charges trapped in the tunneling oxide between the floating gate and the semiconductor substrate.

4. The method to erase a flash EEPROM cell of claim 3 wherein detrapping the flash EEPROM allows a separation of a programmed threshold voltage from an erased threshold voltage to be maintained over the repeated writing and erasing of said flash EEPROM, thus improving said write/erase threshold voltage closure.

5. The method to erase a flash EEPROM cell of claim 1 wherein the first moderately large positive voltage pulse has a voltage of approximately 5.0V.

6. The method to erase a flash EEPROM cell of claim 1 wherein the first relatively large negative voltage pulse has a voltage of approximately −10V.

7. The method to erase a flash EEPROM cell of claim 1 wherein the second moderately large positive voltage pulse has a voltage of approximately 5.0V.

8. The method to erase a flash EEPROM cell of claim 1 wherein the second relatively large negative voltage pulse has a voltage of approximately −10V.

9. The method to erase a flash EEPROM cell of claim 1 wherein the first moderately large positive voltage pulse, the first relatively large negative voltage pulse, second moderately large positive voltage pulse, and the second relatively large negative voltage pulse each have a duration of approximately 10 m to two seconds.

10. The method to erase a flash EEPROM cell of claim 9 wherein a wherein the duration of the first moderately large positive pulse and the first relatively large negative pulse will prevent degradation to the tunneling oxide during the source erasing due to a lesser electric field in said tunneling oxide.

11. A non-volatile semiconductor memory device comprising:
   a semiconductor substrate of a first conductivity type;
   a first diffusion well of a second conductivity type diffused into said semiconductor substrate;
   a second diffusion well of the first conductivity type diffused into said first diffusion well
   a pair of diffusions of a second conductivity type spaced distally from one another to form a source region and a drain region within said second diffusion well;
   a tunneling oxide insulation disposed upon said semiconductor substrate in a region generally between the source region and drain region in correspondence with a channel region and having a thickness which allows tunneling of carriers there through;
   a floating gate electrode disposed upon said tunneling oxide insulation generally in correspondence with said channel region;
   an inter-poly dielectric insulation disposed upon said floating gate electrode to insulate said floating gate;
   a control gate electrode disposed upon said inter-poly dielectric insulation generally aligned with said floating gate; and
   an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:
   coupling a first source to the first diffusion well to apply a first moderately large positive voltage pulse to the second diffusion well,
   simultaneously coupling a second voltage source to the control gate to apply a first relatively large negative voltage to the control gate,
   simultaneously coupling the ground reference potential to the semiconductor substrate, and
   simultaneously floating said drain and said first diffusion well,
   and wherein said trapped electrical charges in the tunneling oxide are detrapped subsequent to the removing of the charges from the floating gate, by the steps of:
   floating said source, drain, and first diffusion well,
   coupling the ground reference potential to said semiconductor substrate and second diffusion well,
   simultaneously coupling a third voltage source to apply a second relatively large negative voltage pulse to said control gate, and
   simultaneously coupling a fourth voltage source to the source to apply a second moderately large positive voltage to said source.

12. The non-volatile semiconductor memory device of claim 11 wherein the first moderately large voltage pulse has a voltage of approximately 5.0V.

13. The non-volatile semiconductor memory device of claim 11 wherein the first relatively large negative voltage pulse has a voltage of approximately −10V.

14. The non-volatile semiconductor memory device of claim 11 wherein the second moderately large voltage pulse has a voltage of approximately 5.0V.

15. The non-volatile semiconductor memory device of claim 11 wherein the second relatively large negative voltage pulse has a voltage of approximately −10V.

16. The non-volatile semiconductor memory device of claim 11 wherein the first moderately large positive voltage pulse, the first relatively large negative voltage pulse, second moderately large positive voltage pulse, and the second relatively large negative voltage pulse each have a duration of approximately 10 m to two seconds.

17. The non-volatile semiconductor memory device of claim 16 wherein the duration of the first moderately large positive pulse and the first relatively large negative pulse will prevent degradation to the tunneling oxide during the duration of the second moderately large positive voltage pulse, and the second relatively large negative voltage pulse due to a lesser electric field in said tunneling oxide.

18. A non-volatile semiconductor memory device comprising:
   a semiconductor substrate of a first conductivity type;
   a first diffusion well of a second conductivity type diffused into said semiconductor substrate;
   a second diffusion well of the first conductivity type diffused into said first diffusion well
   a plurality of memory cells arranged in an array wherein each cell comprises:
      a pair of diffusions of a second conductivity type spaced distally from one another to form a source region and a drain region within said second diffusion well,
      a tunneling oxide insulation disposed upon said semiconductor substrate in a region generally between the source region and drain region in correspondence with a channel region and having a thickness which allows tunneling of carriers there through, a floating gate electrode disposed upon said tunneling oxide insulation generally in correspondence with said channel region, an inter-poly dielectric insulation disposed upon said floating gate electrode to insulate said floating gate, and a control gate electrode disposed upon said inter-poly dielectric insulation generally aligned with said floating gate; and an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:

coupling a first source to the first diffusion well to apply a first moderately large positive voltage pulse to the second diffusion well, simultaneously coupling a second voltage source to the control gate to apply a first relatively large negative voltage to the control gate, simultaneously coupling the ground reference potential to the semiconductor substrate, and simultaneously floating said drain and said first diffusion well, and wherein said trapped electrical charges in the tunneling oxide are detrapped subsequent to the removing of the charges from the floating gate by the steps of:

floating said source, drain, and first diffusion well, coupling the ground reference potential to said semiconductor substrate and second diffusion well, simultaneously coupling a third voltage source to apply a second relatively large negative voltage pulse to said control gate, and simultaneously coupling a fourth voltage source to the source to apply a second moderately large positive voltage to said source.

19. The non-volatile semiconductor memory device of claim 18 wherein the first moderately high positive voltage pulse has a voltage of approximately 5.0V.

20. The non-volatile semiconductor memory device of claim 18 wherein the first relatively high negative voltage pulse has a voltage of approximately −10V.

21. The non-volatile semiconductor memory device of claim 18 wherein the second moderately high positive voltage pulse has a voltage of approximately 5.0V.

22. The non-volatile semiconductor memory device of claim 18 wherein the second relatively large negative voltage pulse has a voltage of approximately −10V.

23. The non-volatile semiconductor memory device of claim 18 wherein the first moderately large positive voltage pulse, the first relatively large negative voltage pulse, first moderately large positive voltage pulse, and the second relatively large negative voltage pulse each have a duration of approximately 10 m to two seconds.

24. The non-volatile semiconductor memory device of claim 23 wherein the duration of the first moderately large positive pulse and the first relatively large negative pulse will prevent degradation to the tunneling oxide during the duration of the second moderately large positive voltage pulse, and the second relatively large negative voltage pulse due to a lesser electric field in said tunneling oxide.

25. An erasing circuit to remove charges and to detrap charges from flash EEPROM cells, including a source and a drain diffused within a first well of a first conductivity type which is diffused into a second well of a second conductivity type which is further diffused in to a semiconductor substrate of the first conductivity type, and a control gate, a floating gate, and a tunneling oxide disposed upon the semiconductor substrate, comprising:

a) a first voltage source coupled to the control gate;
b) a second voltage source coupled to the source region;
c) a third voltage source coupled to the drain region;
d) a fourth voltage source coupled to the semiconductor substrate;
e) a fifth voltage source coupled to the first well;
f) a sixth voltage source coupled to the second well
g) an erasing control means coupled to the first, second, third, and fourth voltage sources to control said first, second, third, and fourth voltage sources, wherein a channel erasing to remove charges from said floating gate is accomplished by:

forcing said first voltage source to apply a first relatively large negative voltage pulse to the control gate of said EEPROM cell, simultaneously disconnecting said second voltage source to float the source of said EEPROM cell, simultaneously disconnecting said third voltage source to float the drain of said EEPROM cell, simultaneously disconnecting said sixth voltage source to float the first well, simultaneously forcing the fourth voltage sources to a ground reference potential to apply the ground reference potential to the semiconductor substrate, and forcing said fifth voltage source to apply a first moderately large positive voltage pulse to the second well and wherein a source erasing to detrap trapped charges from tunneling oxide subsequent to removing charges from the floating gate is accomplished by the steps of:

disconnecting said third and sixth voltage sources respectively from the drain and the second well to float said drain and second well, simultaneously forcing said fourth and fifth voltage source to apply the ground reference potential to said semiconductor substrate and to said first well, simultaneously forcing said first voltage source to apply a second relatively large negative voltage pulse to said control gate, and simultaneously forcing said second voltage source to apply a second moderately large positive voltage pulse to said source gate.

26. The erasing means of claim 25 wherein channel erasing followed by a source erasing of the flash EEPROM allows a separation of a programmed threshold voltage from an erased threshold voltage to be maintained over the repeated writing and erasing of said flash EEPROM, thus improving said write/erase threshold voltage closure.

27. The erasing means of claim 25 wherein the first moderately high positive voltage pulse has a voltage of approximately 5.0V.

28. The erasing means of claim 25 wherein the first relatively large negative voltage pulse has a voltage of approximately −10V.

29. The erasing means of claim 25 wherein the second moderately high positive voltage pulse has a voltage of approximately 5.0V.

30. The erasing means of claim 25 wherein the second relatively large negative voltage pulse has a voltage of approximately −10V.

31. The erasing means of claim 25 wherein the first moderately large positive voltage pulse, the first relatively large negative voltage pulse, second moderately large positive voltage pulse, and the second relatively large negative voltage pulse each have a duration of approximately 10 m to two seconds.

32. The erasing means of claim 31 wherein the duration of the first moderately large positive pulse and the first relatively large negative pulse will prevent degradation to the tunneling oxide during the duration of the second moderately large positive voltage pulse, and the second relatively large negative voltage pulse due to a lesser electric field in said tunneling oxide.

* * * * *